US008471355B2

(12) United States Patent
Kurjanowicz

(10) Patent No.: US 8,471,355 B2
(45) Date of Patent: Jun. 25, 2013

(54) AND-TYPE ONE TIME PROGRAMMABLE MEMORY CELL

(75) Inventor: Wlodek Kurjanowicz, Arnprior (CA)

(73) Assignee: Sidense Corp., Ottawa, Ontario (CA)

( * ) Notice: Subject to any disclaimer, the term of this patent is extended or adjusted under 35 U.S.C. 154(b) by 466 days.

(21) Appl. No.: 12/609,605

(22) Filed: Oct. 30, 2009

(65) Prior Publication Data

US 2011/0103127 A1    May 5, 2011

(51) Int. Cl.
*H01L 23/52*    (2006.01)
*H01L 27/11*    (2006.01)

(52) U.S. Cl.
USPC ............ 257/530; 257/50; 257/379; 257/529; 257/E23.147

(58) Field of Classification Search
USPC ............ 257/50, 288, 379, 528–530, E23.147, 257/E23.149
See application file for complete search history.

(56) References Cited

U.S. PATENT DOCUMENTS

| 7,402,855 | B2 | 7/2008 | Kurjanowicz |
| 2007/0165441 | A1 | 7/2007 | Kurjanowicz |
| 2007/0257331 | A1 | 11/2007 | Kurjanowicz |
| 2008/0074915 | A1 | 3/2008 | Terzioglu et al. |
| 2008/0283931 | A1* | 11/2008 | Wada .............................. 257/379 |
| 2009/0170030 | A1 | 7/2009 | Scheuerlein et al. |

FOREIGN PATENT DOCUMENTS

WO    2008/077237    7/2008

OTHER PUBLICATIONS

Canadian Patent Application No. 2,682,092 Office Action dated Dec. 23, 2009.

* cited by examiner

*Primary Examiner* — Allison P Bernstein
(74) *Attorney, Agent, or Firm* — Shin Hung; Borden Ladner Gervais LLP

(57) ABSTRACT

An AND-type anti-fuse memory cell, and a memory array consisting of AND-type anti-fuse memory cells. Chains of AND type anti-fuse cells are connected in series with each other, and with a bitline contact, in order to minimize the area occupied by the memory array. Each AND type anti-fuse cell includes an access transistor serially connectable to the bitline or the access transistors of other AND type anti-fuse cells, and an anti-fuse device. The channel region of the access transistor is connected to the channel region of the anti-fuse device, and both channel regions are covered by the same wordline. The wordline is driven to a programming voltage level for programming the anti-fuse device, or to a read voltage level for reading the anti-fuse device.

14 Claims, 14 Drawing Sheets

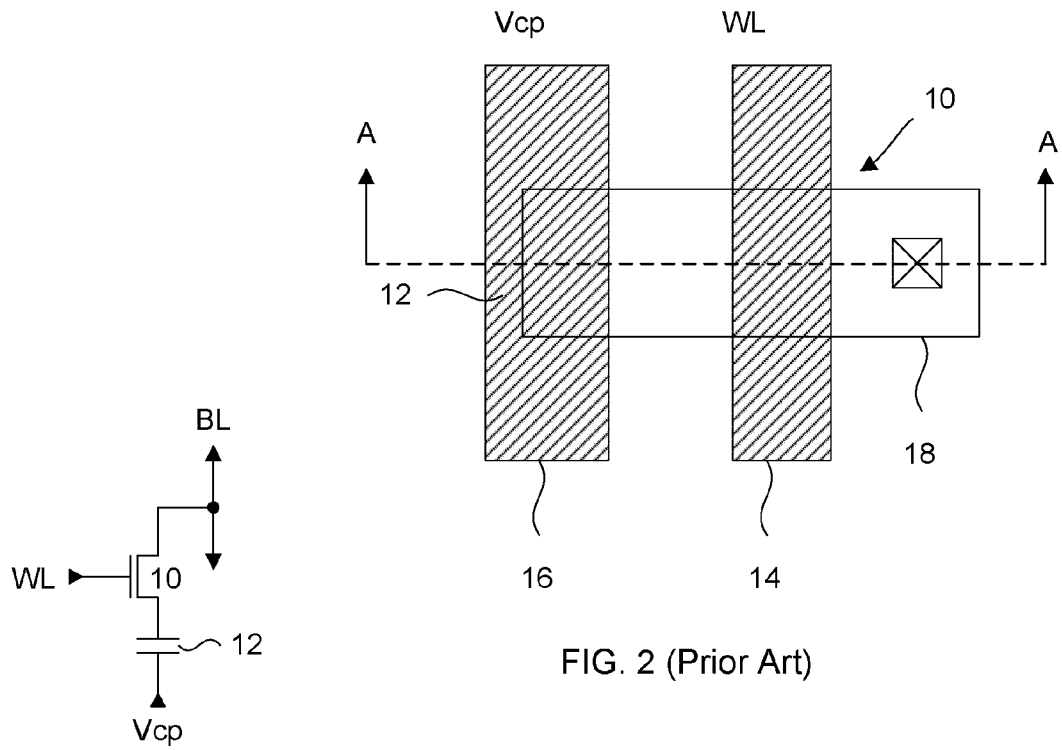
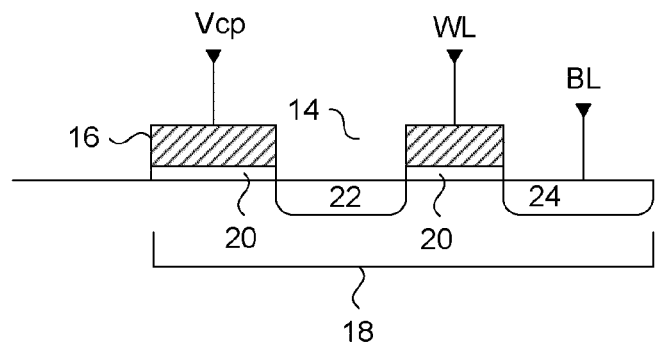
FIG. 1 (Prior Art)
FIG. 2 (Prior Art)
FIG. 3 (Prior Art)

AND-TYPE ONE TIME PROGRAMMABLE MEMORY CELL

FIELD OF THE INVENTION

The present invention relates generally to non-volatile memory. More specifically, the invention is directed to one-time programmable (OTP) memories.

BACKGROUND OF THE INVENTION

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level of flexibility since any data can be programmed.

Anti-fuse memory can be utilized in all one time programmable applications, including RF-ID tags. RF-ID tagging applications are gaining more acceptance in the industry, particularly in sales, security, transport, logistics, and military applications for example. The simplicity and full CMOS compatibility anti-fuse memory allows for application of the RF-ID tag concept to integrated circuit manufacturing and testing processes. Therefore, IC manufacturing productivity can be increased by utilizing anti-fuse memory in combination with an RF communication interface on every wafer and/or every die on the wafer allowing for contact-less programming and reading chip specific or wafer specific information during IC manufacturing and packaging, as well as during printed circuit board assembly.

FIG. 1 is a circuit diagram of a known anti-fuse memory cell, while FIGS. 2 and 3 show the planar and cross-sectional views respectively of the anti-fuse memory cell shown in FIG. 1. The anti-fuse memory cell of FIG. 1 includes a pass, or access transistor 10 for coupling a bitline BL to a bottom plate of anti-fuse device 12. Anti-fuse device 12 is considered a gate dielectric breakdown based anti-fuse device. A wordline WL is coupled to the gate of access transistor 10 to turn it on, and a cell plate voltage Vcp is coupled to the top plate of anti-fuse device 12 for programming anti-fuse device 12.

It can be seen from FIGS. 2 and 3 that the layout of access transistor 10 and anti-fuse device 12 is very straight-forward and simple. The gate 14 of access transistor 10 and the top plate 16 of anti-fuse device 12 are constructed with the same layer of polysilicon, which extend across active area 18. In the active area 18 underneath each polysilicon layer, is formed a thin gate oxide 20, also known as a gate dielectric, for electrically isolating the polysilicon from the active area underneath. On either side of gate 14 are diffusion regions 22 and 24, where diffusion region 24 is coupled to a bitline. Although not shown, those of skill in the art will understand that standard CMOS processing, such as sidewall spacer formation, lightly doped diffusions (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses should be reliable while simple to manufacture with a low cost CMOS process.

FIG. 4B shows a cross-sectional view of an anti-fuse transistor taken along line B-B of the anti-fuse transistor show in FIG. 4A that can be manufactured with any standard CMOS process. This anti-fuse transistor and its variants are disclosed in commonly owned U.S. Pat. No. 7,402,855 issued on Jul. 22, 2008, and commonly owned U.S. Patent Publication No. 20070257331 A1 published on Nov. 8, 2007, the contents of which are incorporated by reference. In the presently shown example, the anti-fuse transistor is almost identical to a simple thick gate oxide, or input/output MOS transistor with one floating diffusion terminal. The disclosed anti-fuse transistor, also termed a split-channel capacitor or a half-transistor, can be reliably programmed such that the fuse link between the polysilicon gate and the substrate can be predictably localized to a particular region of the device. The cross-section view of FIG. 4B is taken along the channel length of the device. The channel is generally understood to be the area underneath an overlying polysilicon gate, having a length defined by edges of the polysilicon gate adjacent respective diffusion regions. Expressed in the alternative, the channel is underlying the polysilicon gate.

Anti-fuse cell 30 includes a variable thickness gate oxide 32 formed on the substrate channel region 34, a polysilicon gate 36, sidewall spacers 38, a field oxide region 40 a diffusion region 42, and an LDD region 44 in the diffusion region 42. A bitline contact 46 is shown to be in electrical contact with diffusion region 42. The variable thickness gate oxide consists of a thick gate oxide 32 and a thin gate oxide 33 such that a portion of the channel length is covered by the thick gate oxide and the remaining portion of the channel length is covered by the thin gate oxide. Generally, the thin gate oxide is a region where oxide breakdown can occur. The thick gate oxide edge meeting diffusion region 42 on the other hand, defines an access edge where gate oxide breakdown is prevented and current between the gate 36 and diffusion region 42 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 42 is connected to a bitline through a bitline contact 46, or other line for sensing a current from the polysilicon gate 36, and can be doped to accommodate programming voltages or currents. This diffusion region 42 is formed proximate to the thick oxide portion of the variable thickness gate oxide. To further protect the edge of anti-fuse cell 30 from high voltage damage, or current leakage, a resistor protection oxide (RPO), also known as a salicide protect oxide, can be introduced during the fabrication process to further space metal particles from the edge of sidewall spacer 38. This RPO is preferably used during the salicidiation process for preventing only a portion of diffusion region 42 and a portion of polysilicon gate 36 from being salicided. It is well known that salicided transistors are known to have higher leakage and therefore lower breakdown voltage. Thus having a non-salicided diffusion region 42 will reduce leakage. Diffusion region 42 can be doped for low voltage transistors or high voltage transistors or a combination of the two resulting in same or different diffusion profiles.

A simplified plan view of the anti-fuse cell 30 is shown in FIG. 4A. Bitline contact 46 can be used as a visual reference point to orient the plan view with the corresponding cross-sectional view of FIG. 4B. The active area 48 is the region of the device where the channel region 34 and diffusion region 42 is formed, which is defined by an OD mask during the fabrication process. The dashed outline 50 defines the areas in which the thick gate oxide is to be formed via an OD2 mask during the fabrication process. More specifically, the area enclosed by the dashed outline 50 designates the regions where thick oxide is to be formed. OD simply refers to an oxide definition mask that is used during the CMOS process for defining the regions on the substrate where the oxide is to be formed, and OD2 refers to a second oxide definition mask different than the first. According to an embodiment of the present invention, the thin gate oxide area bounded by edges of the active area 48 and the rightmost edge of the OD2 mask, is minimized. In the presently shown embodiment, this area can be minimized by shifting the rightmost OD2 mask edge towards the parallel edge of active area 48. FIG. 4C is a schematic showing a transistor symbol representing the anti-fuse cell 30 shown in FIGS. 4B and 4A. As can be seen in FIG. 4C, anti-fuse cell 30 has its gate connected to a wordline and its diffusion region 42 connected to a bitline. Commonly owned U.S. Patent Application No. 20070257331 A1 published on Nov. 8, 2007, the contents of which is incorporated by reference, describes alternate single transistor anti-fuse memory cells which can be used in a non-volatile memory array.

FIG. 5 is a plan view layout of a single transistor anti-fuse memory cell memory array according to an embodiment of the present invention. In the present example, only four wordlines and four bitlines are shown. Each single transistor anti-fuse cell 30 in memory array 60 has one polysilicon gate 62, and have the same structure as anti-fuse cell 30 of FIGS. 4B and 4A. In memory array 60, the polysilicon line forming polysilicon gates 62 of each anti-fuse memory cell are common to all the anti-fuse memory cells of the row. Memory array 60 is shown to include sixteen anti-fuse memory cells, where four are arranged in each of first row 64, second row 66, third row 68 and fourth row 70. Wordlines WLi, WLi+1, WLi+2 and WLi+3 are connected to the polysilicon gates 62 of rows 64, 66, 68 and 70 respectively. The dashed outlines 72 define the areas in the memory array in which a thick gate oxide is to be formed via a thick gate oxide definition mask during the fabrication process. In the configuration shown in FIG. 5, each pair of memory cells from rows 64 and 66 share a common diffusion region 74 and a common bitline contact 76. Each bitline contact is connected to a different bitline, such as bitlines BLn, BLn+1, BLn+2 and BLn+3. Connected to each of the bitlines is a precharge circuit 78, and a column decoder and sense amplifier circuit block 80. The precharge circuit 78 is responsible for precharging all the bitlines to a predetermined voltage for a read operation, while the column decoder and sense amplifier circuit block 80 includes multiplexing devices for sharing one sense amplifier with one or more bitlines. The actual layout of a memory array using the architecture of FIG. 5 can have the precharge circuit 78 located at one end of the bitlines opposite to the column decoder and sense amplifier circuit block 80, or adjacent or integrated with the column decoder and sense amplifier circuit block 80.

An overview of the program and read operations is now discussed with reference to the anti-fuse cell 30 of FIGS. 4B and 4A, and memory array 60 of FIG. 5. Generally, the anti-fuse transistors are programmed by rupturing the gate oxide, preferably at one of the thin/thick gate oxide boundary and the thin gate oxide/source diffusion edge. This is accomplished by applying a high enough voltage differential between the gate and the channel of the cells to be programmed and a substantially lower voltage differential, if any, on all other cells. Therefore, once a permanent conductive link is formed, a current applied to the polysilicon gate will flow through the link and the channel to the diffusion region, which can be sensed by conventional sense amplifier circuits. In the present example, programming of anti-fuse cell 30 is achieved by grounding selected bitlines to 0V, and driving a selected row to a programming voltage level (VPP) that is typically greater than the VDD voltage supply provided to other circuits. Under these conditions, the thin gate oxide 33 is intended to breakdown in the presence of the large electrical field formed between the channel region 34 and the wordline, thereby creating an electrically conductive connection between channel region 34 and polysilicon gate 36. This electrically conductive connection can be referred to as a conductive link or anti-fuse. In FIG. 5 for example, if BLn is grounded and WLi is selected to be driven to VPP, then the anti-fuse cell 30 at the intersection of BLn and WLi will be programmed once its conductive link is formed. Hence any anti-fuse transistor connected to WLi can be programmed if its corresponding bitline is grounded. On the other hand, inhibiting programming of any anti-fuse transistor connected to WLi is done by biasing the bitlines connected to them to VDD. The reduced electric field is insufficient for the conductive link to be formed.

To read a programmed or unprogrammed anti-fuse transistor with a formed conductive link, all the bitlines are precharged to VSS followed by driving a selected wordline to VDD. Any programmed anti-fuse transistor having a conductive link will drive its corresponding bitline to VDD through its VDD driven wordline via the conductive link. The increased bitline voltage can then be sensed. Any unprogrammed anti-fuse transistor having an absence of a conductive link will have no effect on its corresponding bitline, which means that it remains at the VSS precharge level.

The anti-fuse memory cell memory array of FIG. 5 has a relatively high density when compared to a memory array consisting of two-transistor per cell anti-fuse cells, such as the ones shown in FIGS. 1, 2 and 3. In otherwords, for the same area, the anti-fuse memory cell memory array of FIG. 5 has a greater number of memory cells. While each anti-fuse cell 30 is shown to have a bitline contact, the arrangement FIG. 5 maximizes area efficiency because pairs of anti-fuse cells 30 share a common diffusion region connected to a bitline. Those skilled in the art understand that design rules governing the spacing of bitline contacts from other transistors structures, such as wordlines, must be adhered to. Accordingly, further density increases are obtained by scaling of the transistor feature sizes with successive manufacturing process generations. If such processes cannot be used, then the density of the anti-fuse memory cell memory array of FIG. 5 cannot be further increased. In applications where the memory array occupies a significant area of the semiconductor chip relative to other logic, there may be economic factors that require a further reduction of the memory array size without resorting to leading edge, and expensive, manufacturing processes.

It is, therefore, desirable to provide an anti-fuse memory cell which can be used to form a high density memory array.

SUMMARY OF THE INVENTION

It is an object of the present invention to obviate or mitigate at least one disadvantage of previous anti-fuse memory cells.

In a first aspect, the present invention provides an anti-fuse memory cell. The anti-fuse memory cell includes an access transistor, an anti-fuse device and a wordline. The access transistor has a first channel region with a first channel length dimension, and is located adjacent to a diffusion region. The anti-fuse device has a second channel region with a second channel length dimension perpendicular to the first channel length dimension, and is connected to the first channel region. A wordline overlies the first channel region and the second channel region. In one embodiment, the diffusion region is connected to one of a bitline and another access transistor corresponding to an adjacent anti-fuse memory cell. In another embodiment, the access transistor includes a thick gate oxide between the wordline and the first channel region. In this embodiment, the anti-fuse device has a variable thickness gate oxide, and a thick portion of the variable thickness gate oxide is adjacent to the thick gate oxide of the access transistor. The thick portion of the variable thickness gate oxide has a thickness substantially identical to the thick gate oxide. In a further embodiment, the wordline extends in a first direction, and the first channel length of the first channel region extends perpendicular to the wordline. In this embodiment, the second channel length of the second channel region extends parallel to the wordline and has a width extending perpendicular to the wordline. The width of the second channel region is less than the length of the first channel region, and field oxide isolates the second channel region from another second channel region corresponding to the adjacent anti-fuse memory cell.

In a second aspect, there is provided a memory array. The memory array includes a plurality of memory chains and wordlines. The plurality of memory chains are connected in parallel to a bitline, where each of the memory chains includes at least two one time programmable memory cells connected in series with a bitline contact corresponding to the bitline. Wordlines are coupled to the at least two one time programmable memory cells, the wordlines being drivable during a memory operation. In one embodiment, each of the at least two one time programmable memory cells includes an access transistor having a first channel region adjacent to a diffusion region and an anti-fuse device having a second channel region connected to the first channel region. The first channel region and the second channel region are underlying one of the wordlines. In a present embodiment of the second aspect, the wordlines extend in a first direction, and the first channel region has a length extending perpendicular to the wordlines. The second channel region has a length extending parallel to the wordlines and a width extending perpendicular to the wordlines.

In a third aspect, there is provided a method for executing a memory operation on series connected one time programmable memory cells. The method includes biasing a bitline contact connected to the series connected one time programmable (OTP) memory cells to a voltage level; coupling the voltage level to a selected OTP memory cell of the series connected OTP memory cells; and driving a wordline connected to a selected OTP memory cell to a predetermined voltage level. The step of coupling includes turning on intermediate OTP memory cells connected between the selected OTP memory cell and the bitline contact. The method further includes turning off any tail OTP memory cells connected between the selected OTP memory cell and a last OTP memory cell positioned most distant from the bitline contact. The step of turning on can include driving wordlines connected to the intermediate OTP memory cells to a pass voltage level effective for passing the voltage level to the selected OTP memory cell.

In a present embodiment, the memory operation includes a programming operation, wherein the series connected OTP memory cells are programmed sequentially from the selected OTP memory cell to a first OTP memory cell adjacent to the bitline contact. The selected OTP memory cell is a last OTP memory cell most distant from the bitline. In this embodiment, the predetermined voltage level is a programming voltage level, and the voltage level of the bitline contact can be an inhibit voltage to prevent programming of the selected OTP memory cell or an enable voltage to facilitate programming of the selected OTP memory cell. The pass voltage level is equal to or greater than both the inhibit voltage and the enable voltage, and less than the programming voltage level. Alternately, the pass voltage level is maintained while the enable voltage is applied to the selected OTP memory cell. Alternately, the pass voltage level is greater than a threshold voltage of an access transistor of the intermediate OTP memory cells and less than the programming voltage level.

According to yet another embodiment, the memory operation includes a read operation, wherein the predetermined voltage level is a read voltage level, and the voltage level of the bitline contact is precharged to a first voltage level corresponding to a first logic state. The pass voltage level is less than the read voltage level and less than a threshold voltage of a programmed memory cell.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1 is a circuit diagram of a DRAM-type anti-fuse cell;

FIG. 2 is a planar layout of the DRAM-type anti-fuse cell of FIG. 1;

FIG. 3 is a cross-sectional view of the DRAM-type anti-fuse cell of FIG. 2 along line A-A;

DETAILED DESCRIPTION

Generally, the embodiments of the present invention provides an AND-type anti-fuse memory cell, and a memory array consisting of AND-type anti-fuse memory cells. Chains of AND type anti-fuse cells are connected in series with each other, and with a bitline contact, in order to minimize the area occupied by the memory array. Each AND type anti-fuse cell includes an access transistor serially connectable to the bitline or the access transistors of other AND type anti-fuse cells, and an anti-fuse device. The channel region of the access transistor is connected to the channel region of the anti-fuse device, and both channel regions are covered by the same polysilicon wordline. The wordline is driven to a programming voltage level for programming the anti-fuse device, or to a read voltage level for reading the anti-fuse device. The programming voltage level and the read voltage level are sufficiently high to turn on the access transistor for coupling the anti-fuse device to the bitline during programming and read operations.

Because of the unique layout of the AND type anti-fuse memory cell, each chain of serially connected AND type memory cells minimizes the area it occupies on the semiconductor chip. Furthermore, because each chain requires only a single bitline contact, the total number of bitline contacts required for a memory array comprising of such chains is reduced relative to prior art anti-fuse memory arrays. Therefore, a high density anti-fuse memory array is realized with the embodiments of the present invention.

Figure 4A:
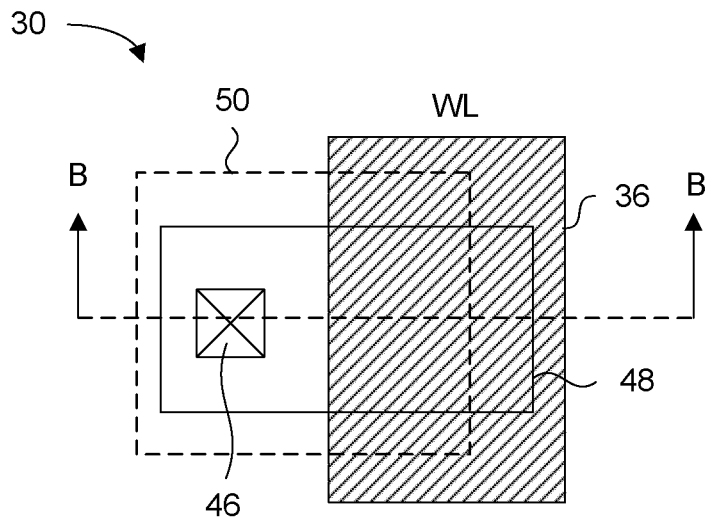
FIG. 4A is a planar layout of the variable thickness gate oxide anti-fuse transistor.
Figure 6A:
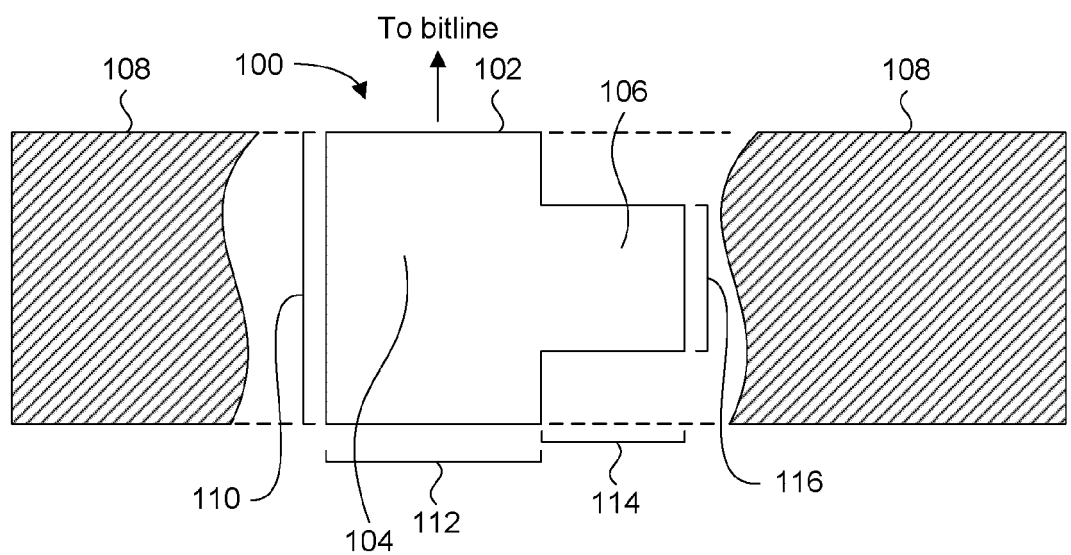
FIG. 6A is a planar layout of an AND type anti-fuse memory cell, according to a present embodiment.
Figure 6B:
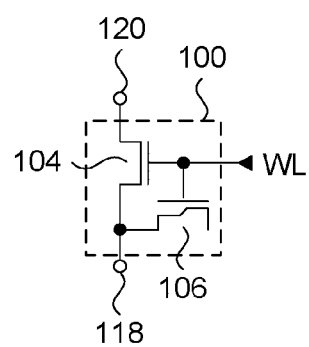
FIG. 6B is an equivalent circuit schematic representing the AND type anti-fuse memory cell of FIG. 6A.

FIG. 6A is a plan view layout showing one AND type anti-fuse memory cell, while FIG. 6B shows an equivalent circuit schematic of the memory cell shown in FIG. 6A, according to an embodiment of the present invention. AND type anti-fuse memory cell 100 has a "T" shaped active area 102 surrounded by insulating field oxide, and includes an access transistor 104 and an anti-fuse device 106. Therefore AND type anti-fuse memory cell 100 is a two transistor cell. In this embodiment and all following embodiments, the AND type anti-fuse memory cell is assumed to be n-type, or n-channel. Those skilled in the art will understand that they can be formed as p-type, or p-channel devices. When fabricated in a memory array, a polysilicon wordline 108 is formed such that it overlies the entire active area 102 to form the gates of access transistor 104 and anti-fuse device 106. The wordline 108 can be formed of other conductive materials, and is therefore not limited to polysilicon. For example, metal gates can be used instead. While not shown in FIG. 6A, gate oxide is formed between the active area 102 and the polysilicon gate 108. Polysilicon gate 108 is broken over the active area 102 in order to clearly show the features of AND type anti-fuse memory cell 100. The access transistor 104 channel region has a length dimension 110 that extends perpendicular to the direction of the polysilicon wordline 108, and a width dimension 112 that extends parallel to the direction of the polysilicon wordline 108. The anti-fuse device 106 channel region has a length dimension 114 that extends parallel to the direction of the polysilicon wordline 108, and a width dimension 116 that extends perpendicular to the direction of the polysilicon wordline 108. In one presently shown embodiment, anti-fuse device 106 can have a variable thickness gate oxide, such as anti-fuse cell 30 shown in FIGS. 4A and 4B. In otherwords, the channel length dimensions of the access transistor 104 and the anti-fuse device 106 are perpendicular to each other. Therefore the transistor symbol used for the anti-fuse device 106 in FIG. 6B is the same as the symbol used for representing the variable thickness gate oxide anti-fuse cell 30 of FIG. 4C.

It should be noted that the channel length and width dimensions of the access transistor 104 and the anti-fuse device 106 extend in different directions relative to each other. Accordingly, along the channel length dimension 114 of anti-fuse device 106, one end of the channel (right-most end for example) is adjacent to field oxide and the other end of the channel (left-most end) is connected to the channel of access transistor 104. Along the channel length dimension 110 of access transistor 104, one end of the channel (bottom end for example) is adjacent to either field oxide or a diffusion region (not shown), while the other end of the channel (top end for example) is adjacent to either a diffusion region (not shown) or a diffusion region with a bitline contact (not shown). In the circuit schematic of FIG. 6B, terminals 118 and 120 represent either diffusion regions or field oxide, depending on the position of anti-fuse cell 100 in a chain of series connected AND type anti-fuse memory cells 100. The gate terminals of access transistor 104 and anti-fuse device 106 are connected to a wordline WL, shown as polysilicon wordline 108 in FIG. 6A.

Figure 7:
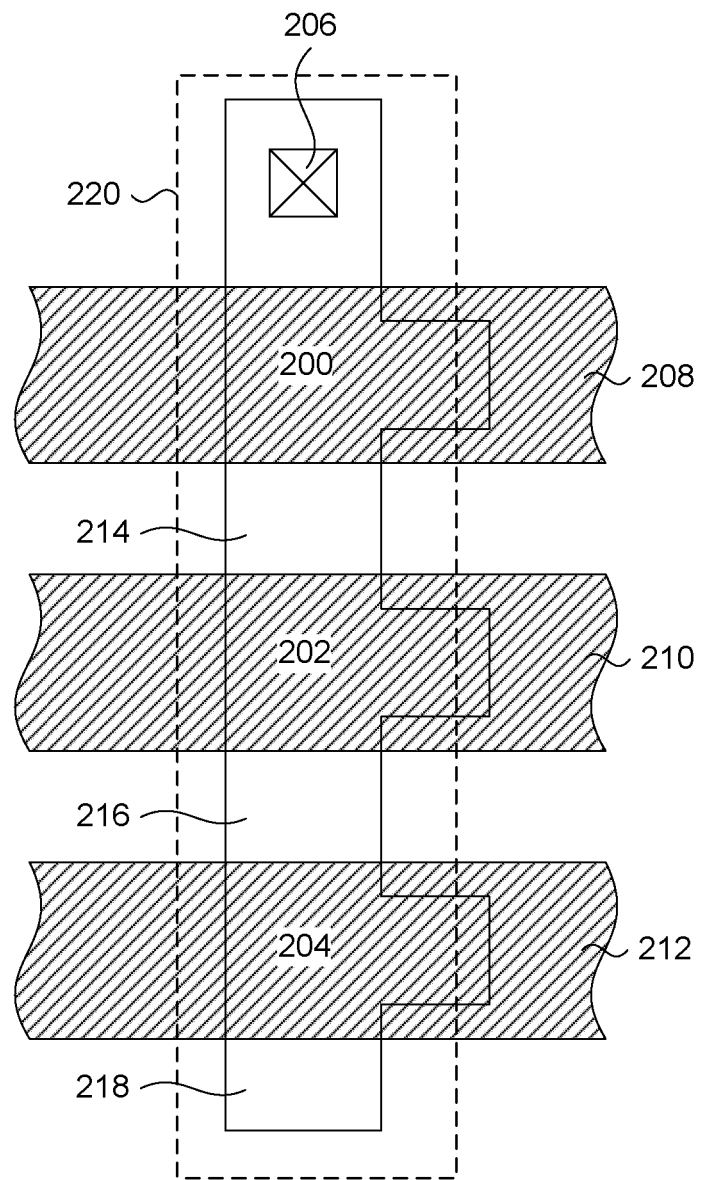
FIG. 7 is a planar layout of a memory chain including serially connected AND type anti-fuse memory cells, according to a present embodiment.

FIG. 7 is a plan view layout showing a series connected chain of three AND type anti-fuse memory cells 200, 202 and 204 connected in series with each other to a bitline contact 206. In the presently shown example, cells 200, 202 and 204 form a series chain of AND type anti-fuse memory cells, simply referred to as a chain of cells from this point forward. Polysilicon wordlines 208, 210 and 212 are formed over respective cells 200, 202 and 204. Formed between cells 200, 202 and cells 202, 204 are diffusion regions 214 and 216 for electrically coupling the cells to each other. An optional diffusion region 218 is formed for the last cell 204 of the chain, which can be omitted without any adverse effect on the operation of the last cell 204. Accordingly, the cells are ordered from a first cell in the chain, that being cell 200 for example, to the last cell 204. For the presently described embodiments, the last cell refers to the cell in the chain that is positioned furthest from the bitline contact while the first cell refers to the cell in the chain that is positioned adjacent, or closest to the bitline contact.

In the presently shown embodiment of FIG. 7, the anti-fuse device has a variable thickness gate oxide. Therefore, a gate oxide definition mask 220 is used to define the areas within which thick gate oxide is to be grown. In the present example, the gate oxide definition mask 220 is shaped as a rectangle, and the area enclosed by the rectangle designates the regions where thick gate oxide is to be grown. Accordingly, based on the positioning of the mask 220, a portion of the channel length of the anti-fuse device not covered by mask 220 will have a thin gate oxide grown thereon, while the channel regions covered by mask 220 will have thick gate oxide grown thereon. Further details of the gate oxide thicknesses for the access transistor and the anti-fuse device are described later.

Figure 8:
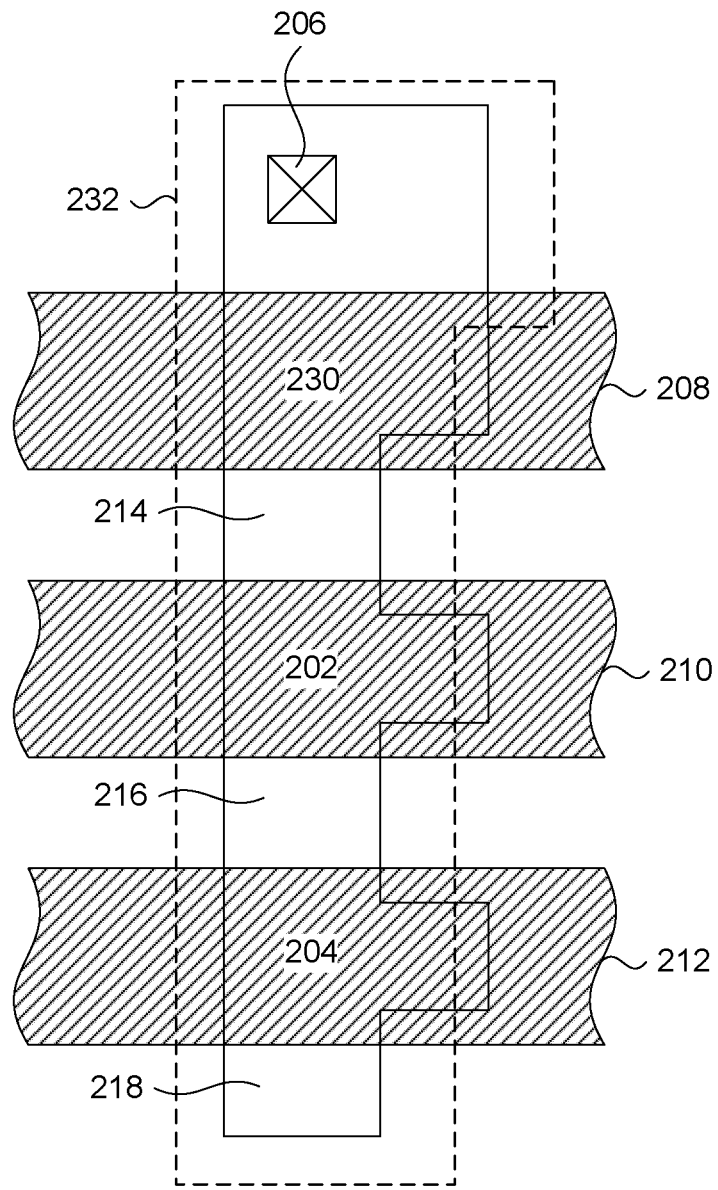
FIG. 8 is a planar layout of an alternate memory chain including serially connected AND type anti-fuse memory cells, according to a present embodiment.

FIG. 8 is an alternate embodiment of the series connected chain of AND type anti-fuse memory cells shown in FIG. 7. This series chain of AND type anti-fuse memory cells is the same as those shown in FIG. 7, therefore the same structures are labeled with the same reference numbers. The main difference between the series chain of memory cells of FIG. 7 and FIG. 8 is that the first AND type anti-fuse memory cell 230 has its anti-fuse device connected directly to both the bitline contact and its corresponding access transistor. Such a layout provides a more compact structure because the bitline contact can be placed closer to the cell, and there is less resistance between the bitline contact and cell 230. Hence the width of the diffusion region containing bitline contact 206 is larger than that of FIG. 7. It is noted that the gate oxide definition mask 232 is shaped differently than gate oxide definition mask 220 of FIG. 7, in that the upper right portion of mask 232 is expanded towards the right direction. The width dimension of the anti-fuse device having the thin gate oxide is maintained to be the same as AND type anti-fuse memory cells 202 and 204. Therefore, the fuse link formation of cell 230 is isolated to the same area as cells 202 and 204.

Figure 9A:
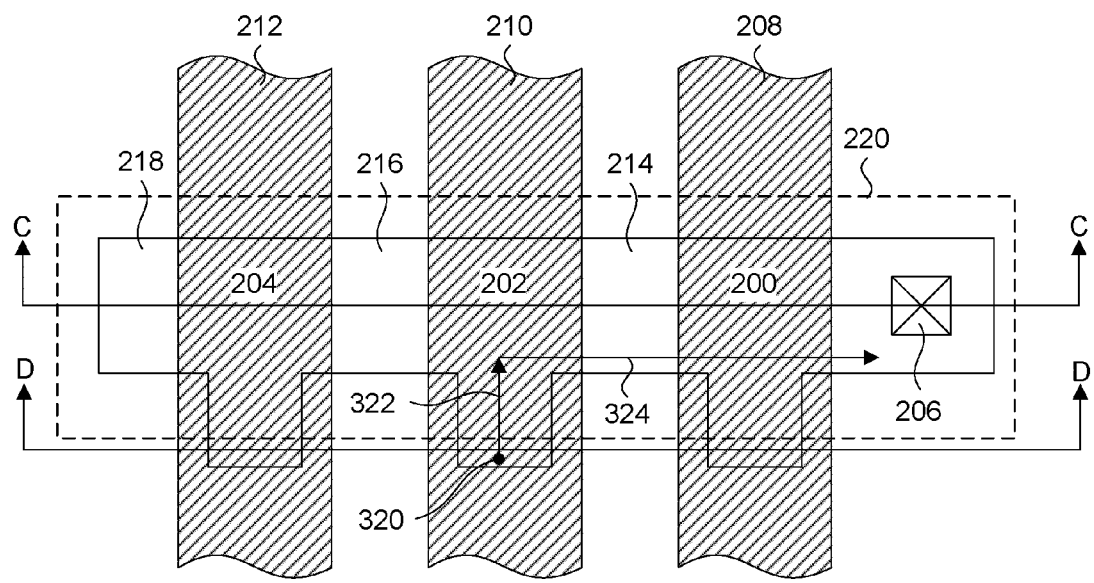
FIG. 9A is a planar layout of the memory chain of FIG. 7 rotated clockwise by 90 degrees.
Figure 9B:
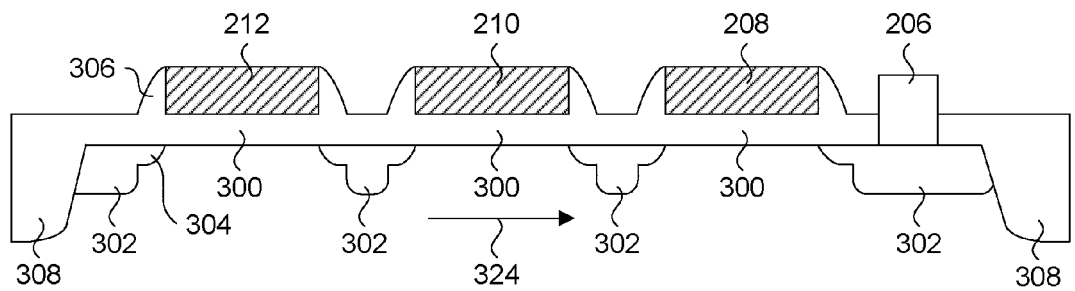
FIG. 9B is a cross-sectional view of the memory chain of FIG. 9A taken along line C-C.
Figure 9C:
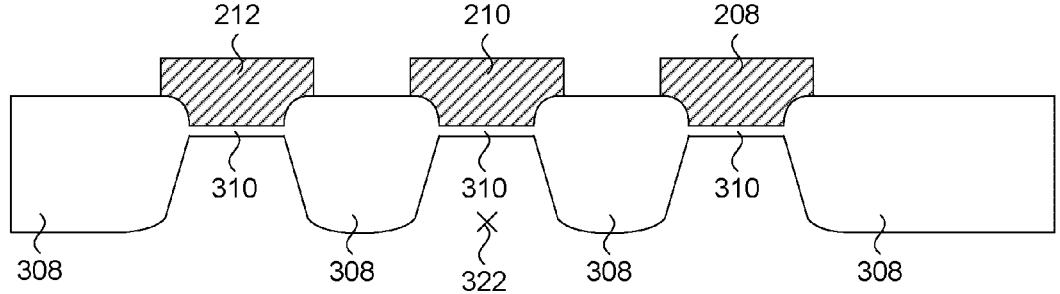
FIG. 9C is a cross-sectional view of the memory chain of FIG. 9A taken along line D-D.

FIG. 9A shows the series connected chain of three AND type anti-fuse memory cells of FIG. 7 rotated clockwise by 90 degrees. In order to illustrate the gate oxide structure at different areas of each AND type anti-fuse memory cell, cross sectional drawings are shown in FIGS. 9B and 9C. FIG. 9B is a cross sectional drawing taken along line C-C of FIG. 9A while FIG. 9C is a cross sectional drawing taken along line D-D of FIG. 9A.

With reference to FIG. 9B, line C-C is within the rectangle of gate oxide definition mask 220, and runs through the access transistors of AND type anti-fuse memory cells 200, 202 and 204. Therefore, the gate oxide overlying the channel region of the access transistors of AND type anti-fuse memory cells 200, 202 and 204 is a thick gate oxide, referred to as thick gate oxide 300. This thick gate oxide can have a thickness equivalent to the gate oxides of input/output transistors, and can therefore be formed at the same time during the fabrication process. By example, thick gate oxide 300 can be the same thickness as the thick portion of variable thickness gate oxide 32 of FIG. 4B. Alternately, thick gate oxide 300 can be formed separately using dedicated fabrication steps, having a thickness designed to resist formation of a conductive link between the polysilicon gate (i.e. 200, 202 and 204) and the underlying channel under programming conditions designed for forming a conductive link in the anti-fuse device portion of the cell. Formed between polysilicon gates 200, 202 and 204 are diffusion regions 302 and corresponding lightly doped drains (LDD) regions 304. In FIG. 9B, only one LDD region is labeled, as those skilled in the art should recognize the other LDD regions corresponding to the diffusion regions 302. Other structures such as sidewall spacers 306 (of which only one is labeled) and shallow trench isolation (STI) 308 are well known to those skilled in the art. From FIG. 9B, it is clear that the access transistors of AND type anti-fuse memory cells 200, 202 and 204 are connected in series with each other.

With reference to FIG. 9C, line D-D is outside the rectangle of gate oxide definition mask 220, and runs through the anti-fuse devices of AND type anti-fuse memory cells 200, 202 and 204. Therefore, the gate oxide overlying the channel region of the anti-fuse devices of AND type anti-fuse memory cells 200, 202 and 204 is a thin gate oxide, referred to as thin gate oxide 310. This thin gate oxide can have a thickness equivalent to the gate oxides of core area transistors, such as high speed logic circuits, and can therefore be formed at the same time during the fabrication process. By example, thin gate oxide 310 can be the same thickness as the thin portion of variable thickness gate oxide 32 of FIG. 4B. In the present embodiment, anti-fuse device has a variable thickness gate oxide similar to variable thickness gate oxide 32 of FIG. 4B. This will be seen in further detail in FIG. 10B. Alternately, thin gate oxide 310 can be formed separately using dedicated fabrication steps, having a thickness designed to enable formation of a conductive link between the polysilicon gate (i.e. 200, 202 and 204) and the underlying channel under programming conditions. The active area, or channel region of the anti-fuse device of each AND type anti-fuse memory cell 200, 202 and 204 bordered on its three sides by STI 308. FIG. 9C shows two of the sides bordered by STI 308. The third side is spaced from the access transistor of the cell.

Any programmed AND type anti-fuse memory cell will have a conductive link formed in the thin gate oxide 310 of its anti-fuse device, thereby allowing current applied on the polysilicon wordline to flow towards the bitline 206. It is noted that this current flows in two different directions. The first direction flows from the thin gate oxide area of the anti-fuse device towards the channel region of the corresponding access transistor. The second direction is substantially perpendicular to the first direction, and flows from diffusion regions to the bitline contact 206. The following example illustrates the current flow, with reference to FIGS. 9A, 9B and 9C. Presuming that AND type anti-fuse memory cell 202 is programmed, it will have a conductive link 320. When polysilicon gates 208 and 210 are biased to a read voltage while a bitline connected to bitline contact 206 is grounded, current from polysilicon wordline 210 flows through the conductive link 320 towards the channel of the access transistor of AND type anti-fuse memory cell 202. In FIG. 9C, this current flow in the first direction is into the page as denoted by direction marker 322 shown as an "X". Because the polysilicon wordline 210 is biased to the read voltage, it is turned on and the current from the programmed anti-fuse device flows in the second direction towards the bitline contact 206, as denoted by arrow 324 in FIG. 9B. The plan view of FIG. 9A clearly shows the first current flow direction 322 followed by the second current flow direction 324.

Figures 10A, 10B:
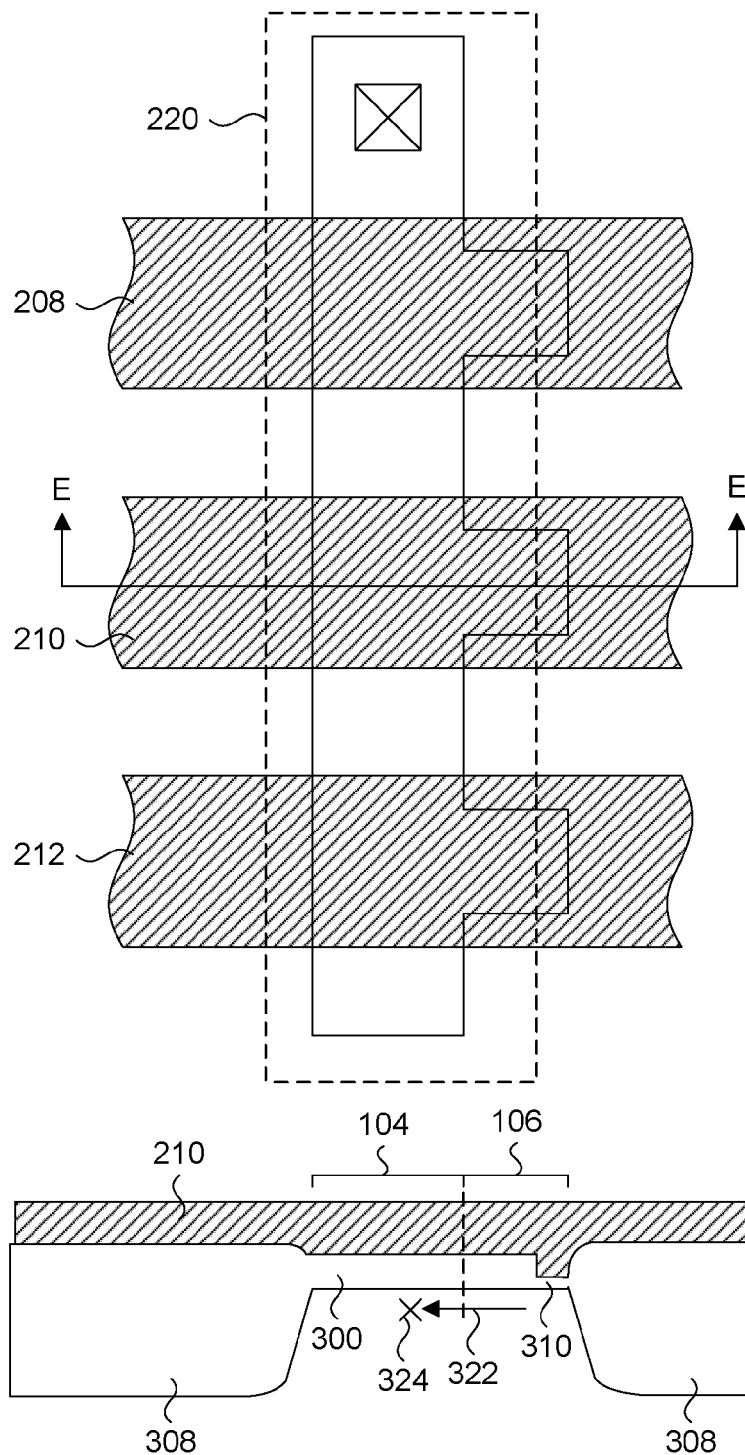
FIG. 10A is a planar layout of the memory chain of FIG. 7 showing cross section line E-E.
FIG. 10B is a cross-sectional view of the memory chain of FIG. 10A taken along line E-E.

FIG. 10A shows the series connected chain of three AND type anti-fuse memory cells of FIG. 7. FIG. 10B is a cross sectional drawing taken along line E-E of FIG. 10A, which illustrates the variable thickness gate oxide of the anti-fuse device of one AND type anti-fuse memory cell. FIG. 10B shows polysilicon wordline 210 covering STI 308, thick gate oxide 300 and a thin gate oxide 310. Reference is made to FIG. 6A, which defines the various features of one AND type anti-fuse memory cell that are now discussed for FIG. 10B. The thick gate oxide 300 extends across the width dimension (112) of the channel of the access transistor 104 and a portion of the length dimension (114) of the anti-fuse device 106. Positioned between an end of thick gate oxide 300 and STI 308 is the thin gate oxide 310. The junction between the thick gate oxide 300 and the thin gate oxide 310 is aligned with an edge of gate oxide definition mask 220 of FIG. 10A. It is noted that anti-fuse device 106 has a variable gate oxide similar in structure to variable gate oxide 32 of the anti-fuse transistor cell 30 of FIG. 4B. FIG. 10B shows the current flow in the AND type anti-fuse memory cell using reference numbers 322 and 324 shown in FIGS. 9C and 9B respectively. Assuming that a conductive link is formed in thin gate oxide 310, current provided via polysilicon wordline 210 driven to a read voltage flows in the first direction denoted by arrow 322. Then the current flows in the second direction into the page, as denoted by direction marker 324 shown by an "X". Therefore, the first direction is substantially transverse to the second direction, meaning that the channel of anti-fuse device 106 is connected to the channel region of access transistor 104, and the channel lengths of anti-fuse device 106 and access transistor 104 are perpendicular to each other.

Figure 5:
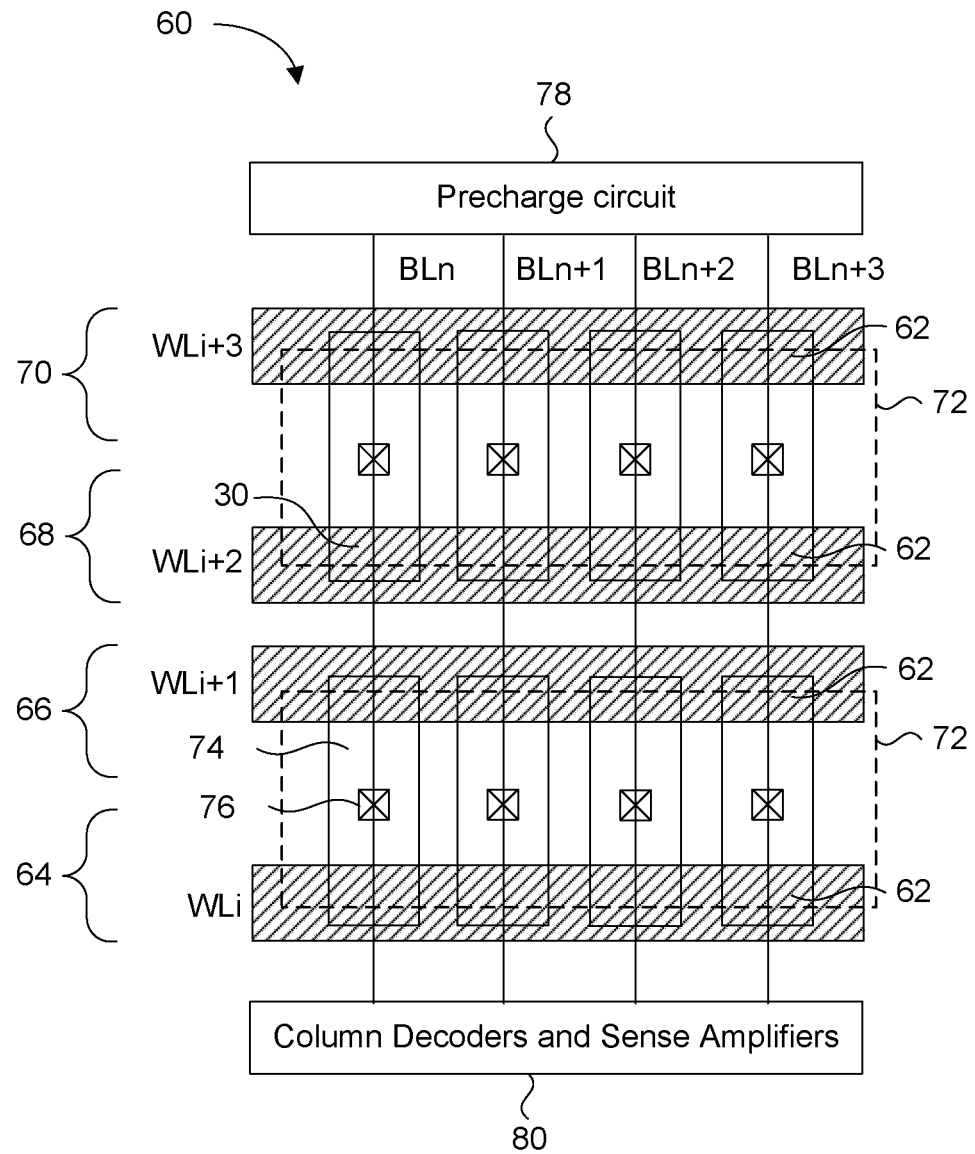
FIG. 5 is a plan view of a single-transistor anti-fuse memory array using the variable thickness gate oxide memory cell of FIG. 4A.

FIGS. 7 to 10B show how a number of AND type anti-fuse memory cells can be connected serially with each other and to one bitline contact. Each group of AND type anti-fuse memory cells connected serially with each other and to one bitline is referred to as a memory cell chain. Since bitline contacts must be spaced from other structures, such as polysilicon gates and isolation oxide such as STI, by a minimum distance, the high ratio of memory cells per bitline contact results in a more densely packed memory array than the memory array of FIG. 5, which has at most two memory cells per bitline contact.

Figure 11A:
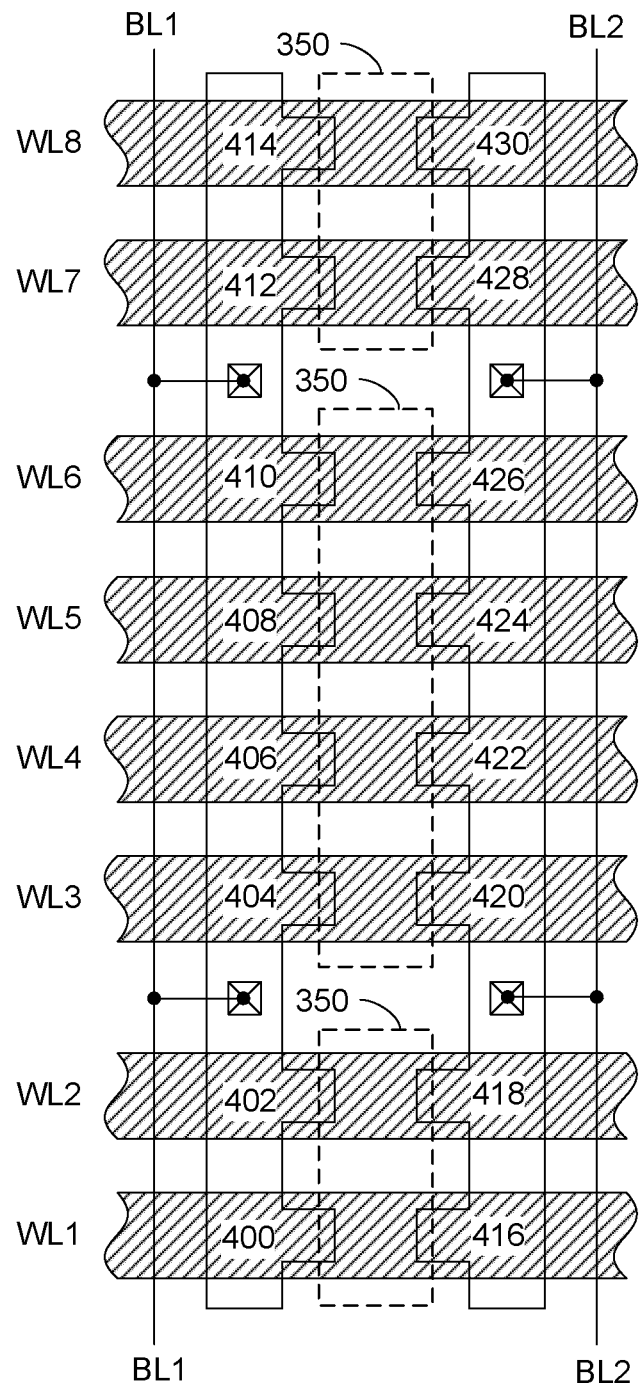
FIG. 11A is a planar layout showing a portion of a memory array of memory chains, according to a present embodiment.

FIG. 11A shows a portion of a memory array using the memory cell chains shown in FIGS. 7 to 10B, according to a present embodiment. The memory array portion of FIG. 11A includes 16 AND type anti-fuse memory cells labeled with reference numbers 400 to 430, two bitlines BL1 and BL2, and eight wordlines WL1 to WL8. A gate oxide definition mask 350 is now shown in FIG. 11A as a rectangle within which thin gate oxide is formed. Therefore, the area outside of the rectangle 350 is where thick gate oxide is formed. In the present embodiment, each memory cell chain includes a pair of AND type anti-fuse memory cells connected in series with each other and to a bitline. Bitline BL1 is connected to a first memory cell chain including cells 400, 402, a second memory cell chain including cells 404, 406, a third memory cell chain including cells 408, 410, and a fourth memory cell chain including cells 412, 414. Bitline BL2 is connected to a fifth memory cell chain including cells 416, 418, a sixth memory cell chain including cells 420, 422, a seventh memory cell chain including cells 424, 426, and an eighth memory cell chain including cells 428, 430. Thus it can be seen that each bitline contact is connected to a pair of memory cell chains, for a total of four AND type anti-fuse memory cells. It is noted that cells 406 and 408 share a common diffusion area, as do cells 422 and 424. Accordingly, the second and third memory chains are coupled to each other, as are the sixth and seventh memory chains. This physical arrangement is referred to as a global bitline diffusion configuration. In the global bitline diffusion configuration, the active areas for all the memory chains connected to the corresponding bitline are connected to each other. More specifically, the active areas for the access transistors of each AND type anti-fuse memory cell corresponding to a bitline are globally connected to each other in series. As shown in FIG. 11A, cells 400 to 414 (first to fourth memory chains) are formed in a single active area that begins at the bottom horizontal edge of cell 400 and ends at the top horizontal edge of cell 414. Hence they have the appearance of all being serially connected with each other.

Figure 11B:
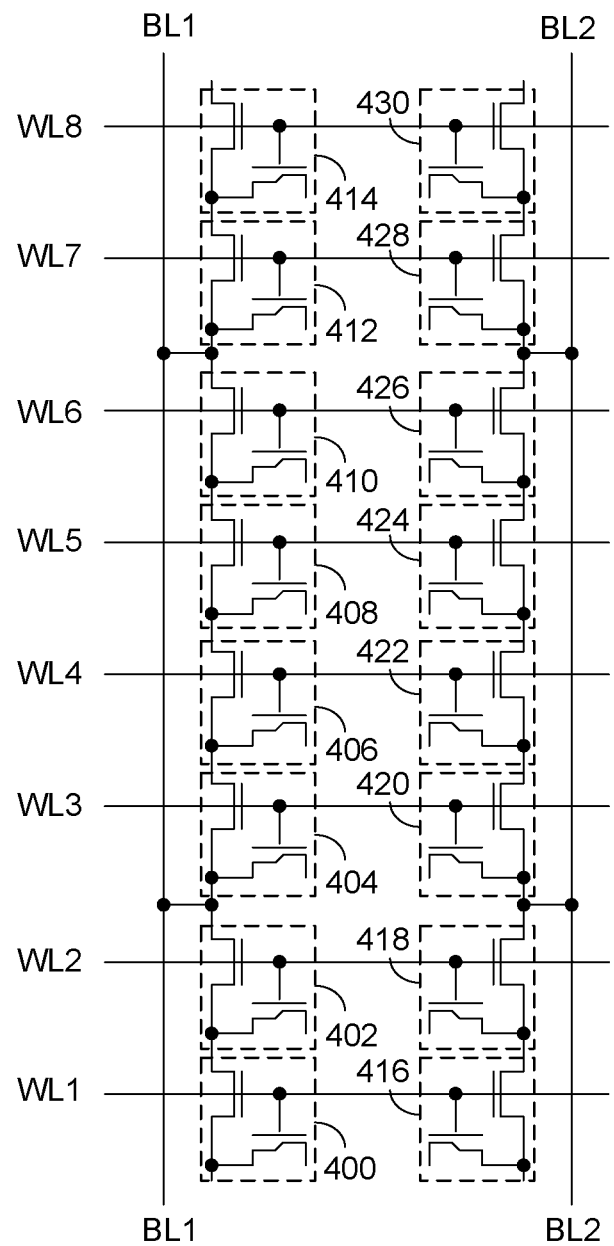
FIG. 11B is an equivalent circuit schematic of the memory array of FIG. 11A.

FIG. 11B is an equivalent circuit schematic of the memory array shown in FIG. 11A. Each of AND type anti-fuse memory cells 400 to 430 of FIG. 11A are represented by the equivalent transistor circuit first shown in FIG. 6B. Since each memory chain is connected in parallel to its corresponding bitline (BL1 or BL2), only one AND type anti-fuse memory cell of one memory chain per bitline is accessed during any read or program operation. Details of how to read and program the serially connected AND type anti-fuse memory cells is discussed later.

Figure 12A:
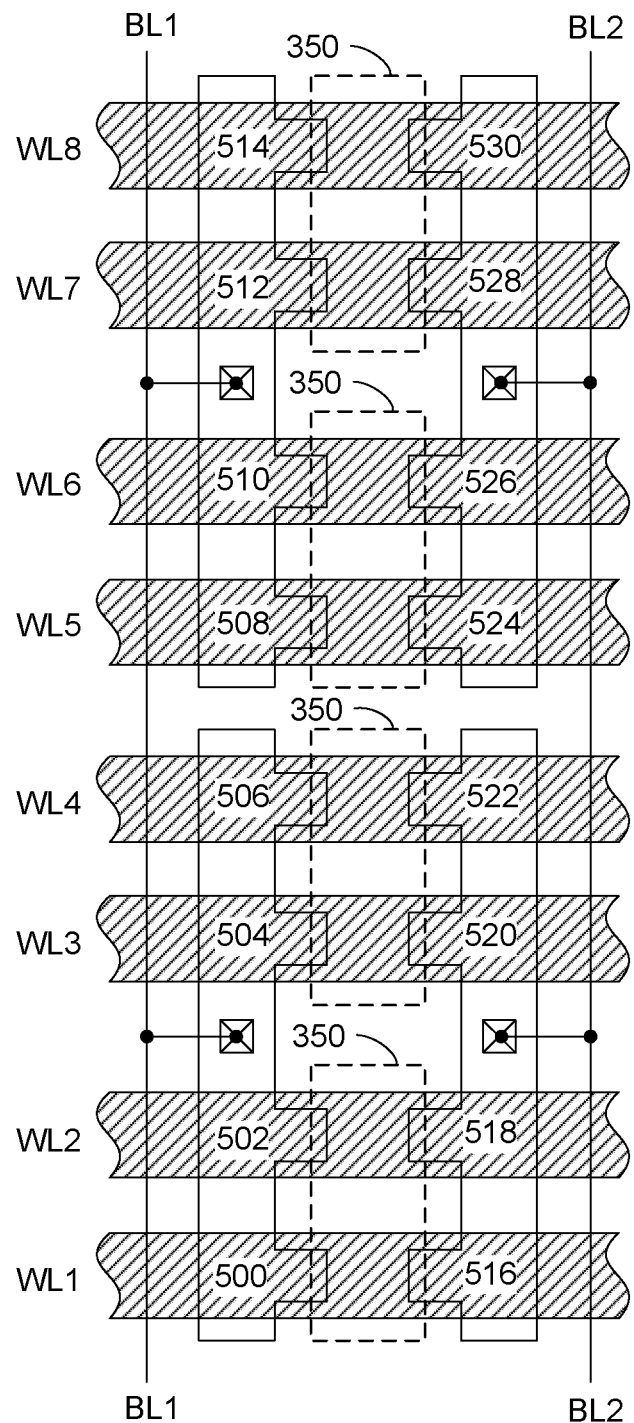
FIG. 12A is an alternate planar layout showing a portion of a memory array of memory chains, according to a present embodiment.

FIG. 12A shows an alternate memory array configuration to the memory array configuration shown in FIG. 11A. While FIG. 11A is formed with a global bitline diffusion configuration, the alternate memory array of FIG. 12A is formed with a local bitline diffusion configuration. The memory array portion of FIG. 12A includes 16 AND type anti-fuse memory cells labeled with reference numbers 500 to 530, two bitlines BL1 and BL2, and eight wordlines WL1 to WL8. The AND type anti-fuse memory cells are organized as memory chains each having two serially connected AND type anti-fuse memory cells. Bitline BL1 is connected to a first memory cell chain including cells 500, 502, a second memory cell chain including cells 505, 506, a third memory cell chain including cells 508, 510, and a fourth memory cell chain including cells 512, 514. Bitline BL2 is connected to a fifth memory cell chain including cells 516, 518, a sixth memory cell chain including cells 520, 522, a seventh memory cell chain including cells 524, 526, and an eighth memory cell chain including cells 528, 530.

As mentioned earlier, the memory array of FIG. 12A is formed with a local bitline diffusion configuration, as opposed to the global bitline diffusion configuration used in FIG. 11A. In the local bitline diffusion configuration, a specific number of memory chains are formed in their own local active areas. With reference to the embodiment of FIG. 12A for example, cells 506 and 508 are physically separated from each other, as are cells 522 and 524. This separation can take the form of STI or field oxide. As shown in FIG. 12A, there are multiple active areas connected to each bitline. For example, the first and second memory chains including cells 500 to 506 are formed in their own local active area. In an alternative embodiment, one memory chain can be formed in its own local active area. It is noted that the gate oxide definition mask 350 is discontinuous between WL4 and WL5 in this particular embodiment.

Figure 12B:
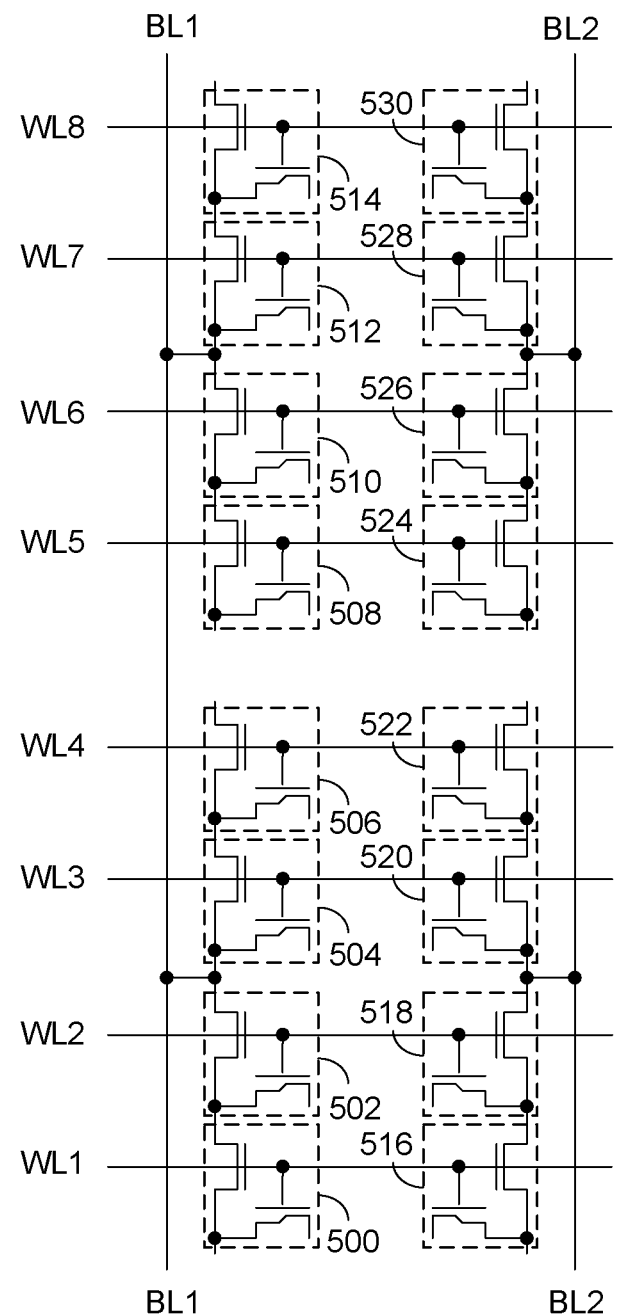
FIG. 12B is an equivalent circuit schematic of the memory array of FIG. 12A.

FIG. 12B is an equivalent circuit schematic of the memory array shown in FIG. 12A. Each of AND type anti-fuse memory cells 500 to 530 of FIG. 12A are represented by the equivalent transistor circuit first shown in FIG. 6B. As clearly shown in FIG. 12B, cells 506 and 508 are electrically and physically separated from each other, as are cells 522 and 524.

One advantage of the embodiment of FIG. 11A is that the memory array will have a smaller footprint than the memory array of FIG. 12A, because STI isolation is formed between cells 506 and 508 and cells 522 and 524. Another advantage of the embodiment of FIG. 11A is that it allows for testability of the memory array. For example, if there is something wrong with the bitline contact, a cell in the chain can be read through an alternate BL contact. One advantage of the memory array of FIG. 12A is the potential reduction of current leakage through the adjacent cells of different memory chains.

Now that the AND type anti-fuse memory cell has been described by itself and in a memory chain, as shown in FIGS. 6 to 12B, a discussion of program and read operations follows. First is a discussion of how the AND type anti-fuse memory cell is programmed when configured in a memory chain, such as the ones shown in FIGS. 11A to 12B for example.

The following general principle is applicable for program and read operations executed on the series connected AND type anti-fuse memory cells of a memory chain connected to a bitline. From this point forward, and AND type anti-fuse memory cell is simply referred to as a "cell". A selected cell has its wordline biased to a first voltage level, and the memory cells connected between the bitline and the selected cell have their wordlines biased to a second voltage level to electrically couple the selected cell to the bitline. The bitline can be biased to different voltages depending on the operation being executed. The second voltage level is referred to as a pass voltage. Following are details of this principle applied to a program operation and to a read operation.

In order to program a cell of the memory chain, the bitline is biased to a program enable voltage, such as 0V for example, and the gate of a selected memory cell is driven to a programming voltage, referred to as VPP. If the program enable voltage is 0V, then VPP is a positive voltage high enough to cause breakdown of the thin gate oxide and formation of the conductive link between the polysilicon wordline and the underlying channel. The program enable voltage is coupled to the anti-fuse device of the selected cell by driving the wordlines of the cells connected between the selected cell and the bitline to a program pass voltage level. These cells are referred to as intermediate cells, and the program pass voltage is selected to be high enough to turn on the access transistors of each intermediate cell for passing the programming current from the selected cell to the bitline, but lower than VPP to prevent programming of the anti-fuse devices of the intermediate cells.

In order to read a cell of the memory chain, the bitline is precharged to a precharge voltage, such as 0V for example. The gate of a selected memory cell is driven to a read voltage, referred to as VRR. When the bitline is precharged to 0V, VRR is some positive voltage sufficiently high to turn on the anti-fuse device. If a conductive link is present in the selected cell, then current will flow through the cell via the VRR biased wordline. Hence, the intermediate cells are biased to a read pass voltage sufficiently high to turn on the access transistors of the intermediate cells, but below the programmed Vt of any intermediate programmed cell.

Figure 4B:
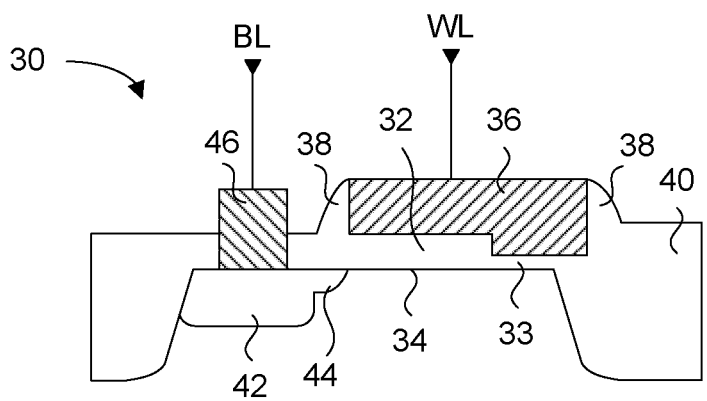
FIG. 4B is a cross-sectional view of a variable thickness gate oxide anti-fuse transistor of FIG. 4A.
Figure 4C:
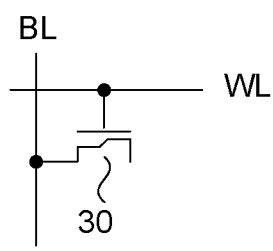
FIG. 4C is a transistor symbol representing the variable thick gate oxide anti-fuse transistor of FIGS. 4A and 4B.

It has been observed though in experiments that the anti-fuse device of FIG. 4B has its current-voltage (I-V) characteristics change in a programming operation due to the thin gate oxide breakdown. In a programming operation, the threshold voltage (Vt) of the programmed anti-fuse device is higher after the programming than before the programming operation, as well as its channel resistance. One hypothesized reason for this phenomenon is that a very high temperature is created locally during the oxide breakdown, which causes accumulation of boron ions from the epitaxial layer in the breakdown location, thereby increasing the Vt of the programmed cell and its channel resistance. Another possible explanation for the increase of Vt and channel resistance after anti-fuse programming is an increase of the fixed gate oxide positive charge at the interface of silicon and silicon dioxide of the damaged gate oxide. After programming, there are more generation and recombination centers for free electrons due to broken silicon-oxide bonds in silicon dioxide molecules. Thus, when the gate of the anti-fuse device is biased to a voltage of at least this Vt, then current will flow through the conductive link and into the channel.

The supply voltage VDD for some high performance, low voltage manufacturing processes is about 1V. The programmed Vt for the anti-fuse device of the cell according to the embodiments can be in the range of 1V. Therefore the read voltage VRR should be set to a voltage greater than VDD, such as 2V for example. Accordingly, the read pass voltage should not exceed the 1V Vt of a programmed anti-fuse device. However, the access transistor of each cell may have a Vt close to 1V. While the read pass voltage may be sufficient to turn on the access transistors of the intermediate cells, additional margin can be provided by lowering the Vt of the access transistors for the cells. This can be done through an ion implantation step to adjust the Vt of only the cell access transistors. Any other process steps achieving a lowered Vt for the cell access transistors can be used. The lowered Vt improves the current drive strength of the access transistors for the same read pass voltage, thereby improving read and program speed.

Therefore, for a programming operation, the following parameters can be set for the voltages to be used.

1) VPP>Vpass_pgm>Vt_access; where VPP is the program voltage applied to a selected cell, Vpass_pgm is the pass voltage applied to intermediate cells during programming, and Vt_access is the threshold voltage of an access transistor of the cell. It should be understood to persons skilled in the art that Vt_access is the threshold voltage required for forming an inversion layer in the channel of the access transistor such that current flows either from one diffusion region to another, or from the anti-fuse device to a diffusion region.

2) VRR>Vpass_rd<Vt_anti-fuse; where VRR is the read voltage applied to a selected cell, Vpass_rd is the pass voltage applied to intermediate cells during reading, and Vt_anti-fuse is the threshold voltage of a programmed anti-fuse device of the cell. It should be understood to persons skilled in the art that Vt_anti-fuse is the threshold voltage required for forming an inversion layer in the channel of the anti-fuse device such that current flows between the wordline and access transistor.

Figure 13:
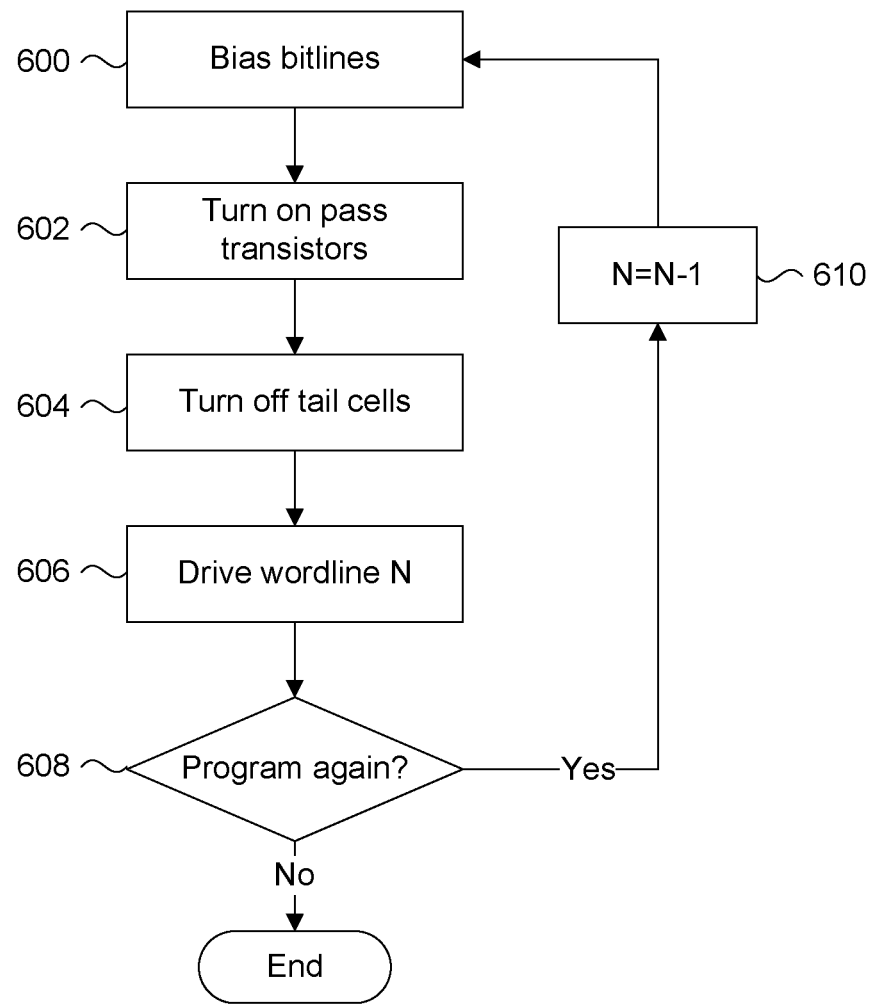
FIG. 13 is a flow chart of a method for programming cells of a memory chain, according to a present embodiment; and, FIG. 14 is a flow chart of a method for reading one cell of a memory chain, according to a present embodiment.

FIG. 13 is a flow chart showing a method for programming cells of memory chains, according to a present embodiment. It is assumed that there are N cells connected serially in the memory chain to the bitline, where N is an integer value greater than 1. In the present method, the last cell in the memory chain is programmed first, where the last cell is the one furthest from the bitline contact. The method starts at step 600 where a bitline is biased to VSS, or 0V, to effect programming of a cell. Alternately, the bitline can be biased to VDD to inhibit programming since the biasing of the bitlines is data dependent. Thus different bitlines having cells connected to the same selected wordline may be biased to different voltages. Following at step 602, the intervening wordlines between the selected wordline and the bitline are driven to the read pass voltage Vpass_rd. These intervening wordlines are connected to intermediate cells. In the present programming iteration, this would be cells 1 to N-1. At step 604 the tail cells are turned off, where tail cells are those which are positioned between the selected cell and up to and including the last cell in the memory chain. Since this is the first programming iteration and the last cell N is being programmed, there are no tail cells to turn off. VSS on the bitline is now coupled to the selected cell N connected to the selected wordline. The selected wordline N is driven to VPP at step 606 while the intermediate cells remain turned on with the read pass voltage, and the anti-fuse device of the selected cell N is programmed. The intermediate cells remain on to ensure that current can flow from the selected wordline to the bitline to form the conductive link in the anti-fuse device.

At this point in the method, a word of data corresponding to the selected wordline N has been programmed, and a program verify step can be executed to ensure that the programming operation was successful. Commonly owned PCT Patent Publication No. WO2008/077237 titled "A program Verify Method for OTP Memories", which is incorporated herein by reference in its entirety, discusses a program verify method applicable to anti-fuse based memory cells similar to those described in the present application. Assuming that programming was successful, the method proceeds to decision step 608. If no further data is to be programmed, then the method ends. Otherwise, the method loops back to step 600 via step 610 where N is decremented. Therefore, in the next program iteration that follows steps 602, 604 and 606, cell N-1 is programmed next. In this following iteration, the previously programmed cell N becomes the tail cell. In step 604, the tail cell(s) are turned off by setting the corresponding wordline to VSS.

Table 1 below summarizes example biasing of the wordlines and the bitlines during a program operations for the cells connected to WL1 and WL2 in FIG. 12B. It is assumed that cells 500 and 502 are to be programmed, while cells 516 and 518 are not to be programmed.

TABLE 1

| Operation | WL1 | WL2 | WL3 | BL1 | BL2 |
| --- | --- | --- | --- | --- | --- |
| Program cell 500 | VPP (5 V) | VRR (2 V) | VSS (0 V) | VSS (0 V) | VRR (2 V) |
| Program cell 502 | VSS (0 V) | VPP (5 V) | VSS (0 V) | VSS (0 V) | VRR (2 V) |

In Table 1, an inhibit voltage, such as read voltage VRR of 2V for example, is applied to bitline BL2 to inhibit programming of cell 516 when a programming voltage level VPP is applied to WL1 and cell 518 when VPP is applied to WL2. VRR is also applied to WL2 of the intermediate cell 502 as the program pass voltage (Vpass_pgm). Therefore VRR from BL2 minus a threshold voltage is coupled to cell 516 via the access transistor of cell 518, thereby inhibiting programming of its anti-fuse device. When WL2 is driven to VPP, the full VRR level is coupled to cell 518 to inhibit programming of its anti-fuse device. When WL2 is driven to VPP, the tail cells 500 and 516 are turned off by setting WL1 to VSS. This helps prevent current leakage through cells 500 and 516. It is noted that WL3 is biased to VSS for this same reason during programming of any cells of the first memory chain and the fifth memory chain. To program cells 500 and 502, bitline BL1 is biased to an enable voltage, such as 0V, to allow cells 500 and 502 to be programmed when WL1 and WL2 are driven to the programming voltage level VPP.

and VRR can be used by sense circuitry for determining the logic '0' or '1' state of the bitline. Examples of sensing methods which can be used in the presently described memory array having memory cell chains are disclosed in commonly owned U.S. Patent Publication No. 2007/0165441 titled "High Speed OTP Sensing Scheme", the contents of which are incorporated by reference in its entirety.

Table 2 below summarizes example biasing of the wordlines during a read operation for the cells connected to WL1 and WL2 in FIG. 12B. It is assumed that cells 500 and 502 are to be read in different cycles at random. It is noted that WL3 is maintained at VSS to keep its corresponding cell turned off. The wordlines connected to the other memory chains are also kept at VSS. This is to minimize current leakage into the other memory chains connected to the same bitline. It should be noted that the intermediate cell, such as wordline WL2 connected to cell 502 when reading cell 500, is set to a read pass voltage that is less than VRR during the entire read cycle.

TABLE 2

| Operation | WL1 | WL2 | WL3 | BL1 | BL2 |
| --- | --- | --- | --- | --- | --- |
| Read cell 500 | VRR (2 V) | VDD (1 V) | VSS (0 V) | VSS (0 V) | VDD (1 V) |
| Read cell 502 | VSS (0 V) | VRR (2 V) | VSS (0 V) | VSS (0 V) | VDD (1 V) |

Figure 14:
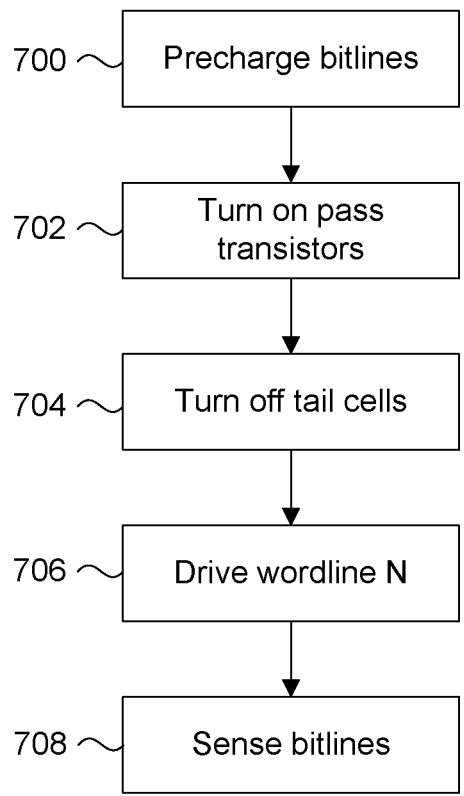

FIG. 14 is a flow chart showing a method for reading cells of one memory chain, according to a present embodiment. While programming of the cells of a chain are programmed in sequence from the furthest cell to the most proximate cell to the bitline contact, reading can be done at random. Once again, it is assumed that there are N cells connected serially in the memory chain to the bitline, where N is an integer value greater than 1. The method starts at step 700 by precharging all the bitlines to a first voltage, such as VSS for example. Then any wordlines connected to intermediate cells are driven to a read pass voltage (Vpass_rd) at step 702, followed by the turning off of any tail cells by driving their wordlines to VSS at step 704. Alternately, only the tail cell immediately adjacent the selected cell needs to be turned off. The turning off of one or more tail cells at step 704 is optional in order to minimize current from leaking to other cells of the memory chain. At step 706, the selected wordline is driven to the read voltage VRR. Because the intermediate wordlines are driven to the read pass voltage, any current flowing through the programmed anti-fuse device of the selected cell is coupled to the bitline. Therefore, the bitline is charged from the precharge voltage of VSS towards VRR driven by the selected wordline. After a predetermined period of time, the bitline is sensed at step 708. It is noted that the sequence of steps 702 and 704 can be reversed, meaning that the tail cells can be turned off before the wordlines connected to the intermediate cells are driven to the read pass voltage (Vpass_rd).

Those skilled in the art should understand that the programmed cell will charge its corresponding bitline towards the read voltage VRR. An unprogrammed cell on the other hand will not alter the precharged voltage level of the bitline. Therefore a suitably selected reference voltage between VSS It is noted in the present embodiment that BL2 is set to VDD to compensate for coupling capacitance of the bitlines, which can show a non-programmed cell as a programmed cell if it is adjacent to a programmed cell. The voltages shown in Tables 1 and 2 are example voltages only for achieving the desired read, program and current blocking functions. Persons skilled in the art will understand that variations in manufacturing technologies for fabricating the memory cells may result in the selection of different voltages.

Looking at the program and read flow charts of FIGS. 13 and 14, there are many steps which are substantially common to both. Both methods start with biasing of the bitlines, followed by turning on any access transistors and then driving the selected wordline either to a programming voltage level or a read voltage level. Both also have the optional step of turning off any tail cells while the selected wordline is driven.

As shown by the embodiments of the AND type anti-fuse cells and memory chains made up of serially connected AND type anti-fuse cells, a high density OTP memory array can be fabricated since bitline contacts in the memory array are minimized. While each AND type anti-fuse cell is a two-transistor memory cell, the unique two-dimensional layout facilitates serial connection of each cell to another without significant area overhead penalty.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. An anti-fuse memory cell comprising:
   an access transistor having a first channel region having a first channel length dimension, and adjacent to a diffusion region;
   an anti-fuse device having a second channel region having a second channel length dimension perpendicular to the first channel length dimension, and connected to the first channel region; and
   a wordline overlying the first channel region and the second channel region.

2. The anti-fuse memory cell of claim 1, wherein the diffusion region is connected to one of a bitline and another access transistor corresponding to an adjacent anti-use memory cell.

3. The anti-fuse memory cell of claim 1, wherein the access transistor includes a thick gate oxide between the wordline and the first channel region.

4. The anti-fuse memory cell of claim 3, wherein the anti-fuse device has a variable thickness gate oxide, and a thick portion of the variable thickness gate oxide is adjacent to the thick gate oxide of the access transistor.

5. The anti-fuse memory cell of claim 4, wherein the thick portion of the variable thickness gate oxide has a thickness substantially identical to the thick gate oxide.

6. The anti-fuse memory cell of claim 1, wherein the wordline extends in a first direction, and the first channel length of the first channel region extends perpendicular to the wordline.

7. The anti-fuse memory cell of claim 6, wherein the second channel length of the second channel region extends parallel to the wordline and has a width extending perpendicular to the wordline.

8. The anti-fuse memory cell of claim 7, wherein the width of the second channel region is less than the length of the first channel region.

9. The anti-fuse memory cell of claim 8, wherein field oxide isolates the second channel region from another second channel region corresponding to an adjacent anti-fuse memory cell.

10. A memory array comprising:
    a plurality of memory chains connected in parallel to a bitline, each of the memory chains including at least two one time programmable memory cells connected in series with a bitline contact corresponding to the bitline; and,
    wordlines coupled to the at least two one time programmable memory cells, the wordlines being drivable during a memory operation and each of the at least two one time programmable memory cells includes
    an access transistor having a first channel region, and
    an anti-fuse device having a second channel region connected to the first channel region and oriented perpendicular to the first channel region.

11. The memory array of claim 10, wherein the memory operation includes one of a read operation and a program operation.

12. The memory array of claim 10, wherein
    the first channel region and the second channel region of each of the at least two one time programmable memory cells underlies one of the wordlines.

13. The memory array of claim 12, wherein the wordlines extend in a first direction, and the first channel region has a length extending perpendicular to the wordlines.

14. The memory array of claim 13, wherein the second channel region has a length extending parallel to the wordlines and a width extending perpendicular to the wordlines.

* * * * *

UNITED STATES PATENT AND TRADEMARK OFFICE
CERTIFICATE OF CORRECTION

| | |
|---|---|
| PATENT NO. | : 8,471,355 B2 |
| APPLICATION NO. | : 12/609605 |
| DATED | : June 25, 2013 |
| INVENTOR(S) | : Wlodek Kurjanowicz |

Page 1 of 1

It is certified that error appears in the above-identified patent and that said Letters Patent is hereby corrected as shown below:

In the Claims

Column 17, line 24, claim 2, delete "anti-use" and insert therefor -- anti-fuse --.

Signed and Sealed this
Thirteenth Day of August, 2013

Teresa Stanek Rea
*Acting Director of the United States Patent and Trademark Office*